(12) United States Patent
Olsen et al.

(10) Patent No.: US 8,455,751 B2
(45) Date of Patent: Jun. 4, 2013

(54) THERMOELECTRIC DEVICES AND APPLICATIONS FOR THE SAME

(75) Inventors: Larry C. Olsen, Richland, WA (US); Peter M. Martin, Kennewick, WA (US); John W. Johnston, Yakima, WA (US); John G. DeSteese, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 1362 days.

(21) Appl. No.: 10/726,744

(22) Filed: Dec. 2, 2003

(65) Prior Publication Data
US 2005/0115601 A1    Jun. 2, 2005

(51) Int. Cl.
*H01L 35/16* (2006.01)
*H01L 35/12* (2006.01)
*H01L 35/20* (2006.01)
*H01L 35/28* (2006.01)

(52) U.S. Cl.
USPC .................. 136/240; 136/236.1; 136/225

(58) Field of Classification Search
USPC ................. 136/205, 212, 236.1, 240
See application file for complete search history.

(56) References Cited

U.S. PATENT DOCUMENTS

| | | |
|---|---|---|
| 3,554,815 A | 1/1971 | Osborn |
| 3,648,470 A | 3/1972 | Schultz |
| 3,900,603 A | 8/1975 | Rittmayer et al. |
| 3,931,673 A | 1/1976 | Eggemann |
| 3,945,855 A | 3/1976 | Skrabek et al. |
| 3,981,751 A | 9/1976 | Dashevsky et al. |
| 4,036,665 A * | 7/1977 | Barr et al. ............ 136/202 |
| 4,092,140 A | 5/1978 | Cerutti et al. |
| 4,125,122 A | 11/1978 | Stachurski |
| 4,249,121 A | 2/1981 | Dahlberg |
| 4,312,402 A | 1/1982 | Basiulis |
| 4,328,677 A | 5/1982 | Meckler |
| 4,447,277 A | 5/1984 | Jayadev et al. |
| 4,497,973 A | 2/1985 | Heath et al. |
| 4,520,305 A | 5/1985 | Cauchy |
| 4,566,961 A | 1/1986 | Diaz et al. |
| 4,677,416 A | 6/1987 | Nishimoto et al. |
| 4,859,250 A * | 8/1989 | Buist ................. 136/225 |
| 4,940,976 A | 7/1990 | Gastouniotis et al. |
| 5,228,923 A | 7/1993 | Hed |

(Continued)

FOREIGN PATENT DOCUMENTS

| | | |
|---|---|---|
| CH | 677421 | 5/1991 |
| CN | 1447450 | 10/2003 |

(Continued)

OTHER PUBLICATIONS

H. Bottner, "Thermoelectric Micro Devices: Current State, Recent Developments and Future Aspects for Technological Progress and Applications" Proc. 21st Int. Conf. Thermoelectrics. Long Beach, CA, Aug. 25-29, 2002. pp. 511-518.*

(Continued)

*Primary Examiner* — Mark Eashoo
*Assistant Examiner* — Alexander Kollias
(74) *Attorney, Agent, or Firm* — Klarquist Sparkman, LLP

(57) ABSTRACT

High performance thin film thermoelectric couples and methods of making the same are disclosed. Such couples allow fabrication of at least microwatt to watt-level power supply devices operating at voltages greater than one volt even when activated by only small temperature differences.

15 Claims, 11 Drawing Sheets

U.S. PATENT DOCUMENTS

| | | | |
|---|---|---|---|
| 5,286,304 | A | 2/1994 | Macris et al. |
| 5,505,835 | A | 4/1996 | Sakaue et al. |
| 5,883,563 | A | 3/1999 | Horio et al. |
| 6,046,398 | A | 4/2000 | Foote et al. |
| 6,096,964 | A | 8/2000 | Ghamaty et al. |
| 6,096,965 | A | 8/2000 | Ghamaty et al. |
| 6,162,985 | A | 12/2000 | Parise |
| 6,207,887 | B1 * | 3/2001 | Bass et al. ............ 136/201 |
| 6,215,580 | B1 | 4/2001 | Kouta |
| 6,232,543 | B1 | 5/2001 | Nagata |
| 6,288,321 | B1 | 9/2001 | Fleurial et al. |
| 6,312,617 | B1 | 11/2001 | Kanatzidis et al. |
| 6,340,787 | B1 | 1/2002 | Simeray et al. |
| 6,372,538 | B1 | 4/2002 | Wendt et al. |
| 6,388,185 | B1 | 5/2002 | Fleurial et al. |
| 6,413,645 | B1 | 7/2002 | Graff et al. |
| 6,458,319 | B1 | 10/2002 | Caillat et al. |
| 7,081,677 | B2 | 7/2006 | Yamashita et al. |
| 2002/0139123 | A1 | 10/2002 | Bell |
| 2002/0148236 | A1 | 10/2002 | Bell |
| 2002/0176815 | A1 | 11/2002 | Fleurial et al. |
| 2003/0089391 | A1 | 5/2003 | Fukudome et al. |
| 2003/0099279 | A1 * | 5/2003 | Venkatasubramanian et al. ............ 374/179 |
| 2003/0140957 | A1 | 7/2003 | Akiba |
| 2003/0183839 | A1 | 10/2003 | Yamashita et al. |
| 2004/0075167 | A1 | 4/2004 | Nurnus et al. |
| 2004/0094192 | A1 | 5/2004 | Luo |
| 2004/0231714 | A1 * | 11/2004 | Stark et al. ............ 136/211 |
| 2004/0242169 | A1 | 12/2004 | Albsmeier et al. |
| 2006/0243317 | A1 | 11/2006 | Venkatasubramanian |

FOREIGN PATENT DOCUMENTS

| | | |
|---|---|---|
| DE | 6900274 | 8/1970 |
| DE | 2124465 | 11/1972 |
| DE | 2457586 | 6/1975 |
| DE | 297 23 309 | 3/1997 |
| DE | 29723309 U1 | 10/1998 |
| DE | 10231445 | 1/2004 |
| EP | 0034538 | 8/1981 |
| EP | 0408572 A1 | 8/1989 |
| EP | 0408572 | 1/1991 |
| EP | 0408572 A1 | 1/1991 |
| EP | 0408572 B1 | 2/1993 |
| GB | 1381001 | 1/1975 |
| JP | 43-25391 | 11/1968 |
| JP | 53-031985 | 3/1978 |
| JP | 61259580 | 11/1986 |
| JP | 02198181 | 6/1990 |
| JP | 3-502859 | 6/1991 |
| JP | 5-182911 | 7/1993 |
| JP | 7-7186 | 1/1995 |
| JP | 7-173623 | 7/1995 |
| JP | 7-335943 | 12/1995 |
| JP | 09107129 | 4/1997 |
| JP | 09224387 | 8/1997 |
| JP | 10-51037 | 2/1998 |
| JP | 11-41958 | 2/1999 |
| JP | 2003-92432 | 3/2003 |
| JP | 2003-133600 | 5/2003 |
| JP | 2003179275 | 6/2003 |
| JP | 2004104041 | 4/2004 |
| JP | 2004241657 | 8/2004 |
| JP | 2006086510 | 3/2006 |
| SU | 2113035 | 8/1990 |
| SU | 2113035 C1 | 8/1990 |
| WO | 89/07836 | 8/1989 |
| WO | WO89/07836 | 8/1989 |
| WO | 99/54941 | 10/1999 |
| WO | 00/30185 | 5/2000 |
| WO | 02/23642 | 3/2002 |
| WO | 02/095707 | 11/2002 |
| WO | 03/007391 | 1/2003 |
| WO | 03/015186 | 2/2003 |
| WO | 2004/105143 | 12/2004 |
| WO | 2004/105146 | 12/2004 |
| WO | 2005/074463 | 8/2005 |
| WO | 2005/098970 | 10/2005 |
| WO | 2005/117154 | 12/2005 |
| WO | 2008/013584 | 1/2008 |

OTHER PUBLICATIONS

Sun, C.W. et al, "Crystallization behavior of non-stoichiometric Ge-Bi-Te ternary phase change materials for PRAM application", J. Phys. Condens. Matter. 19 (2007) 446004. 9pp.*

Kim, D.-H. et al, "Effect of deposition temperaute on the structural and thermoelectric properties of bismuth telluride thin films grown by co-sputtering", Thin Solid Films. 510 (2006) 148-153.*

Mattox, D.M. (1998) Handbook of Physical Vapor Deposition (PVD) Processing.. William Andrew Publishing/Noyes. Chapter 6, pp. 343-405. Online version available at: http://knovel.com/web/portal/browse/display?_EXT_KNOVEL_DISPLAY_bookid=63 &VerticalID=0.*

Stölzer, M. et al., "Preparation of Highly Effective p-$Bi_{2.5}Sb_{1.5}Te_3$ and n-$Bi_2Te_{2.7}Se_{0.3}$ Films," $15^{th}$ International Conference on Thermoelectrics, pp. 445-449 (1996).

Stordeur, Matthias et al., "Low Power Thermoelectric Generator—self-sufficient energy supply for micro systems," $16^{th}$ International Conference on Thermoelectrics, pp. 575-577 (1997).

Stark, Ingo et al., "New Micro Thermoelectric Devices Based on Bismuth Telluride-Type Thin Solid Films," $18^{th}$ International Conference on Thermoelectrics, pp. 465-472 (1999).

Stölzer, M. et al., "Optimisation of p-$(Bi_{0.25}Sb_{0.75})_2Te_3$ and n-$Bi_2(Te_{0.9}Se_{0.1})_3$ Films for Thermoelectric Thin Film Components," 5 pages.

Bergstresser, T.R. et al., "Copper on Polyimide Flexible Substrate for Ultra-Thin, High Performance Applications," 4 pages.

Vining, Cronin B., "Semiconductors are cool," Nature, vol. 413, pp. 577-578 (Oct. 11, 2001).

Venkatasubramanian, Rama et al., "Thin-film thermoelectric devices with high room-temperature figures of merit," Nature, vol. 413, pp. 597-602 (Oct. 11 2001).

Chen, G., "Thermal conductivity and ballistic-phonon transport in the cross-plane direction of superlattices," Phys. Rev. B, vol. 57, No. 23, pp. 14958-14973 (Jun. 15, 1998).

Hicks, L.D. et al., "Effect of quantum-well structures on the thermoelectric figure of merit," Phys. Rev. B, vol. 47, No. 19, pp. 12727-12731 (May 15, 1993).

Kiely, J.H. et al., "Characteristics of $Bi_{0.5}Sb_{1.5}Te_3/Be_2Te_{2.4}Se_{0.6}$ thin-film thermoelectric devices for power generation," Meas. Sci. Technol., vol. 8, pp. 661-665 (Jun. 1997).

Nolas, G.S. et al., Thermoelectrics, "Basic Principles and New Materials Developments," Springer, Berline, pp. 111-146 (2001).

Tritt, T., "Recent Trends in Thermoelectric Materials Research III," Academic Press, London, vol. 7, pp. 50-55 (2001).

Schaevitz, Samuel B. et al., "A Combustion-Based MEMS Thermoelectric Power Generator," The $11^{th}$ International Conference on Solid-State Sensors and Actuators, Munich, Germany, 4 pages (Jun. 10-14, 2001).

$21^{st}$ International Conference on Thermoelectrics, Jet Propulsion Laboratory, California Institute of Technology, Massachusetts Institute of Technology; "Texture formation in extruded rods of (Bi,SB)2(Te,Se)3 thermoelectric alloys," Vasilevskiy, E. et al. (Aug. 26-29, 2002).

Thin-film Superlattice Thermoelectric Technology, www.rti.org, 4 pages (2002).

Physics of Thin Films: Sputter Deposition (Ohring: Chapter 3, sections 5-6), www.uccs.edu/~tchriste/courses/PHYS549/549lectures/sputter.html., 4 pages (Printed Nov. 21, 2002).

Physics of Thin Films: Sputter Deposition Techniques (Ohring: Chapter 3, section 7), www.uccs.edu/~tchriste/courses/PHYS549/549lectures/sputtertech.html., 5 pages (Printed Nov. 21, 2002).

Venkatasubramanian, R., "Thin-film Superlattice Thermoelectric Devices for Power Conversion and Cooling," www.its.org/its/ict2002/Abstracts/Rama_Venkatasubramanian.htm (Printed Sep. 26, 2003).

D.T.S. GmbH: Thin Film Thermoelectric Generators, D.T.S., www.dts-generator.com/index.htm (Printed May 4, 2004).

D.T.S. GmbH: Thin Film Thermoelectric Generators, Low Power Thermoelectric Generators; www.dts-generator.com/gen.txe.htm (Printed May 4, 2004).
D.T.S. GmbH: Thin Film Thermoelectric Generators, Infrared-Sensors, www.dts-generator.com/sen-txe.htm (Printed May 4, 2004).
D.T.S. GmbH: Thin Film Thermoelectric Generators, Research and development, www.dts-generator.com/dev-txe.htm (Printed May 4, 2004).
Schmidt, F. et al., "Batterielose Funksensoren, betrieben mit Energie aus der Umgebung," 5 pages (Mar. 2002).
International Search Report and Written Opinion for PCT/US2004/040460, filed Dec. 2, 2004.
Office Action from the United States Patent & Trademark Office in U.S. Appl. No. 10/727,062, dated Jun. 14, 2007.
Abrikosov, N Kh, et al., "Phase transitions and electrophysical properties of the solid solutions based on GeTe at the cross-section of GeTe-AgSbTe$_2$," *Izvestiya Akademii Nauk SSSR, Neoorganicheskie Materialy*, Abstract Only, vol. 20, No. 1, pp. 55-59 (1984).
Androulakis et al., "Nanostructuring and its Influence on the Thermoelectric Properties of the AgSbTe$_2$-SnTe Quaternary System," *Materials Research Society Symposium Proceedings*, vol. 886, Abstract Only, 1 page (2006).
Decheva, S.K., "Studies on the Thermoelectric Characteristics of Cold-Pressed Materials of the Type of (GeTe)x-(AgSbTe$_2$) (1-x)," *Bulgarian Journal of Physics*, Abstract Only, vol. 6, No. 2, pp. 194-200 (1979).
DeSteese, J. G. et al., "Technology Development: Wireless Sensors and Controls BT0201," Excerpt from Statement of Work from PNNL to U.S. Department of Energy, Building Technologies Program, 31 pages (Sep. 2004).
DeSteese, J. G., "Thermoelectric Ambient Energy Harvester," a White Paper for the Defense Logistics Agency, pp. 1-4 (undated).
Martin, P. M. et al., "Si/SiGe Superlattices for Thermoelectric Applications" *Proceedings of the 46th Annual Technical Conference of the Society of Vacuum Coaters*, pp. 126-129 (2003).
Martin, P. M. et al., "Scale Up of Si/ Si$_{0.8}$Ge$_{0.2}$ and B$_4$C/B$_9$C Superlattices for Harvesting of Waste Heat," *Proceedings of DEER*, 6 pages (2003).
Martin, P. M. et al., "Recent Advances in Scale Up of Si/SiGe Superlattices for Thermoelectric Applications," Abstract Only, presented at the Functional Coating and Surface Engineering Conference 2003, Montreal, Canada, 3 pages (Jun. 4-7, 2003).
Martin, P. M. et al., "Nanostructured multilayer B$_4$C/B$_9$C and Si/Si$_{0.8}$Ge$_{0.2}$ films for advanced detector and thermoelectric applications," *Proceedings of 2004 AIMCAL Conference*, 7 pages (2004).
Martin, P. M. et al., "Superlattice Coatings for Device, Structural and Protective Applications," *Proceedings of AIMCAL 2006 Fall Technical Conference*, invited, 10 pages (2006).
Martin, P. M. et al., "Recent advances in magnetron sputtered superlattice and quantum well structures," *Proceedings of SPIE*, vol. 6403, pp. 640310-10-to 640310-11 (2006).
Martin, P. M. et al., "Magnetron-Sputtered Nanolaminate and Superlattice Coatings," *Proceedings of SPIE*, vol. 6403, pp. 640310-1 to 640310-9 (2006).
Office action from the U.S. Patent and Trademark Office in U.S. Appl. No. 11/004,611, dated Jan. 7, 2008.
Office action from the U.S. Patent and Trademark Office in U.S. Appl. No. 10/727,062, dated Jun. 14, 2007.
Plachkova, S.K. et al., "Materials for Thermoelectric Application Based on the System GeTe-AgBiTe$_2$," *Physica Status Solidi (A)*, Abstract Only, vol. 184, Issue 1, pp. 195-200 (Mar. 2001).
Plachkova, S.K., "Thermoelectric figure of merit of the system (GeTe)$_{1-x}$(AgSbTe$_2$)$_x$," *Phys. Stat. Sol (A)*, Abstract Only, vol. 83, No. 1, pp. 349-356 (1984).
Plachkova, S.K., "Thermoelectric Power in the System (GeTe)$_{1-x}$(AgSbTe$_2$)$_x$," *Phys. Status Solidi (A)*, Abstract Only, vol. 80, No. 1, pp. K97-K100 (Nov. 16, 1983).
Sharp, J. W., "Some Properties of GeTe-Based Thermoelectric Alloys," *IEEE 22nd International Conference on Thermoelectrics*, pp. 267-270 (2003).
Yamanaka, S. et al., "Thermoelectric properties of T$_{19}$BiTe$_3$," *Journal of Alloys and Compounds*, vol. 352, pp. 275-278 (2003).

Final Office action from the U.S. Patent and Trademark Office in U.S. Appl. No. 11/004,611, dated Dec. 17, 2008.
Office Action from Chinese Patent Office for Chinese Patent Application No. 200480035827.0, dated Dec. 5, 2008.
Office action from the U.S. Patent and Trademark Office in U.S. Appl. No. 10/727,062, dated Dec. 31, 2008.
Office Action from the European Patent Office for European Patent Application No. 04822138.6, dated Feb. 11, 2009.
Office Action from the Japanese Patent Office for Japanese Patent Application No. 2006-542773, dated Feb. 23, 2009 (with translation).
Final Office action from the U.S. Patent and Trademark Office in U.S. Appl. No. 10/727,062, dated Jun. 16, 2008.
Final Office action from the U.S. Patent and Trademark Office in U.S. Appl. No. 10/581,281, dated Dec. 16, 2009.
Notification of Reasons for Refusal from the Japanese Patent Office for Japanese Patent Application No. 2006-542773, dated Jan. 20, 2010 (with translation).
Nurnus, J. et al., "Structural and Thermoelectric Properties of Bi$_2$Te$_3$ Based Layered Structures," *Proc. 19th Int. Conf. Thermoelectrics*, Cardiff, U.K., pp. 236-240 (Aug. 25-29, 2000).
Office action from the U.S. Patent and Trademark Office in U.S. Appl. No. 10/581,281, dated Apr. 30, 2009.
Final Office action from the U.S. Patent and Trademark Office in U.S. Appl. No. 10/727,062, dated Jul. 20, 2009.
Office action from the U.S. Patent and Trademark Office in U.S. Appl. No. 11/004,611, dated Aug. 3, 2009.
Allinson, A.J. et al., "Microstrucural Changes in a Monostable Chalcogenide Switch Glass," *Journal of Non-Crystalline Solids*, vol. 31, No. 1, pp. 307-331 (Apr. 1, 1979).
Cook, A. B. et al., "Nature of the cubic to rhombohedral structural transformation in (AgSbTe$_2$)$_{12}$(GeTe)$_{85}$ thermoelectric material," *Journal of Applied Physics*, vol. 101, No. 5, pp. 053715-1-053715-6 (Mar. 14, 2007).
International Search Report and Written Opinion for PCT/US2008/074345, filed Aug. 26, 2008 (mailed Sep. 16, 2009).
International Search Report and Written Opinion for PCT/US2008/077748, filed Sep. 25, 2008 (mailed Sep. 22, 2009).
Wagner, Andrew V. et al., "Sputter Deposition of Semiconductor Superlattices for the Thermoelectric Applications," *Mat. Res. Soc. Symp. Proc.*, vol. 450, pp. 467-472 (Dec. 2-5, 1996).
Kim, et al., "Effects of a Reduction Treatment and Te Doping Properties of (Bi1-xSbx)2Te3 Fabricated by Mechanical Alloying," *16th International Conference on Thermoelectrics*, pp. 127-130 (1997).
Yamashita, O. et al., "Bismuth telluride compounds with high thermoelectric figures of merit," *Journal of Applied Physics*, vol. 93, No. 1, pp. 368-374 (Jan. 1, 2003).
Final Office action from the U.S. Patent and Trademark Office in U.S. Appl. No. 11/004,611, dated Mar. 4, 2010.
Notice of Allowance from the U.S. Patent and Trademark Office in U.S. Appl. No. 10/727,062, dated Jan. 11, 2010.
Notice of Reasons for Rejection from the Japanese Patent Office for Japanese Patent Application No. 2006-542773, dated Aug. 19, 2010.
Office Action from the Chinese Patent Office for Chinese Patent Application No. 200480035827.0, dated Aug. 5, 2010.
Notice of Allowance from the U.S. Patent and Trademark Office in U.S. Appl. No. 10/727,062, dated Sep. 20, 2010.
Office Action from the Chinese Patent Office for Chinese Patent Application No. 200480035827.0, dated Aug. 5, 2010 (w/ English translation).
Office action from the U.S. Patent and Trademark Office in U.S. Appl. No. 11/004,611, dated Dec. 17, 2010.
Office action from the U.S. Patent and Trademark Office in U.S. Appl. No. 11/864,877, dated Nov. 23, 2010.
Restriction Requirement from the U.S. Patent and Trademark Office in U.S. Appl. No. 11/864,877, dated Oct. 18, 2010.
Office Action from the Korean Patent Office for Korean Patent Application No. 2006-7013287, dated Feb. 10, 2011 (with translation).
Report NYO 35-82-12, Final Phase I Report for Compact Thermoelectric Program, 42nd Ed., 330 pp., Jun. 28, 1965-Dec. 31, 1965.
Decision on Rejection from the Japanese Patent Office for Japanese Patent Application No. 2006-542773, dated Oct. 3, 2011 (with translation).

Final Office action from the U.S. Patent and Trademark Office in U.S. Appl. No. 11/004,611, dated Jul. 8, 2011.
Final Office action from the U.S. Patent and Trademark Office in U.S. Appl. No. 11/864,877, dated Jan. 5, 2012.
Notice of Reasons for Rejection from the Japanese Patent Office for Japanese Patent Application No. 2006-542773, dated Mar. 5, 2012 (with translation).
Office Action from the Canadian Patent Office for Canadian Patent Application No. 2,549,826, dated Jun. 17, 2011.
Office Action from the Canadian Patent Office for Canadian Patent Application No. 2,549,826, dated Oct. 2, 2012.
Office Action from the Chinese Patent Office for Chinese Patent Application No. 200480035827.0, dated Feb. 23, 2012 (with translation).
Office Action from the Chinese Patent Office for Chinese Patent Application No. 200480035827.0, dated May 18, 2012 (with translation).
Office Action from the Korean Patent Office for Korean Patent Application No. 2006-7013287, dated Nov. 18, 2011 (with translation).
Office action from the U.S. Patent and Trademark Office in U.S. Appl. No. 10/581,281, dated Aug. 11, 2011.
Office action from the U.S. Patent and Trademark Office in U.S. Appl. No. 11/864,877, dated May 23, 2011.
Office action from the U.S. Patent and Trademark Office in U.S. Appl. No. 11/864,877, dated Oct. 17, 2012.
Summons from the European Patent Office for European Patent Application No. 04822138.6, dated Apr. 28, 2011.

* cited by examiner

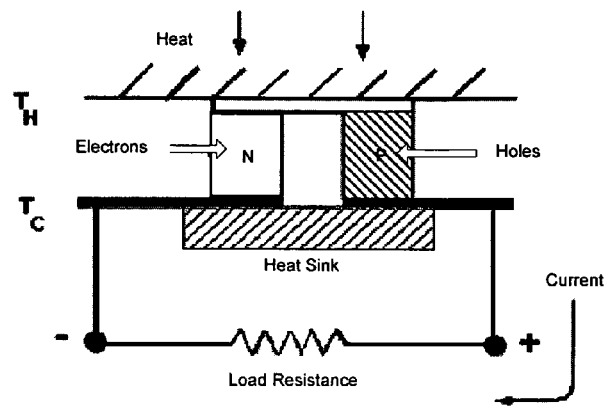
FIG. 1a
PRIOR ART
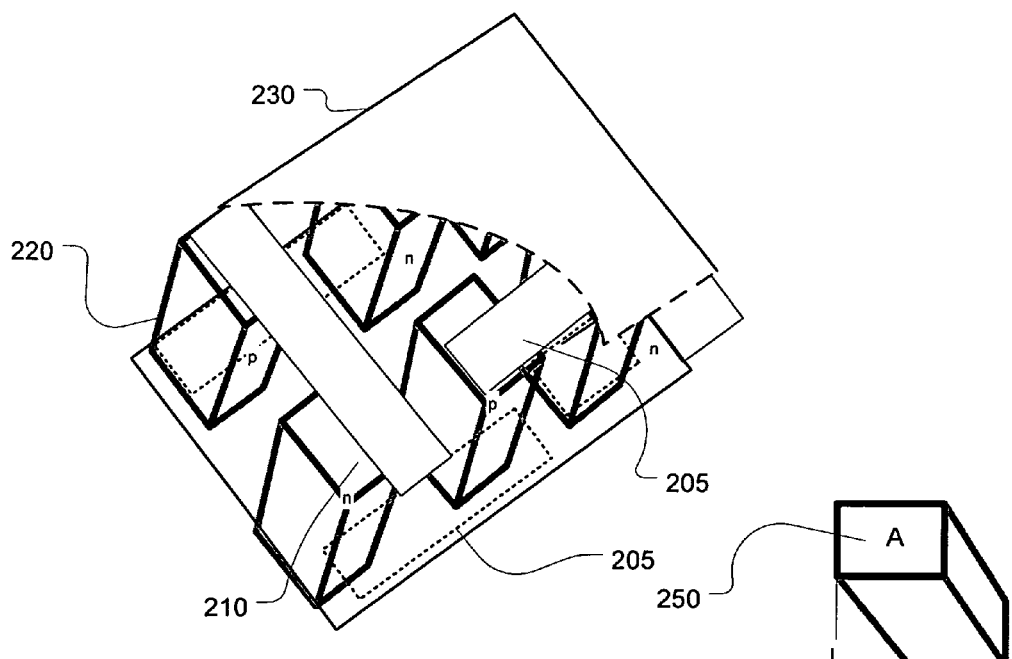
FIG. 1b
PRIOR ART
FIG. 1c
PRIOR ART

THERMOELECTRIC DEVICES AND APPLICATIONS FOR THE SAME

FIELD

The present disclosure relates to thermoelectric devices, materials and methods of making and using the same to produce efficient thermoelectric devices.

BACKGROUND

The increasing use of portable electronics has driven research in the area of portable electric generators. Thermoelectric (TE) power sources have been found to be especially useful. TE power sources typically comprise three parts: a heat source, a heat sink, and a thermopile. The thermopile, consisting of a number of thermocouples connected in series, serves to convert some of the thermal energy into electrical energy. TE power sources generate electric power based on creating a thermal gradient across the thermocouples of the thermopile. The TE power source operates to convert the thermal energy to electric power by accepting thermal energy on a "hot" side or junction, passing it through the thermopile and rejecting heat to a "cold" side or junction.

Certain TE power sources and TE thermocouples in particular are formed using semiconductor materials. Semiconductor materials with dissimilar characteristics are connected electrically in series (to form thermocouples) and thermally in parallel, so that two junctions are created. The semiconductor materials are typically n-type and p-type. In a typical thermoelectric device, the electrically conductive connection is formed between the p-type and n-type semiconductor materials. These materials are so named because of their structure: the n-type has more electrons than necessary to complete a perfect molecular lattice structure while the p-type does not have enough electrons to complete a lattice structure. The extra electrons in the n-type material and the holes left in the p-type material are called "carriers." The carriers are driven from the hot junction to the cold junction as a result of thermal diffusion resulting in an electrical current. For thermoelectric cooling, the electrons and holes transport heat as a result of imposed electrical current. Prior art FIG. 1$a$ illustrates a form of such power conversion. Cooling action results from reversing the process.

A semiconductor TE device's performance is limited by the non-dimensional thermoelectric figure of merit (ZT) of the material, where T is the absolute temperature and Z is the thermoelectric figure of merit, $Z=sa^2/k$ (a—thermoelectric power, s—electrical conductivity, k—thermal conductivity). Typically TE devices are preferably formed of TE materials having relatively high thermoelectric figures of merit. In certain devices, however, the key objective is to produce power at voltages above 1.0 V in as small or compact a device as possible. The known TE materials having relatively high thermoelectric figures of merit cannot be deposited as thin films on substrates useful for forming small TE power source devices. Thus, although more efficient materials (i.e., materials with high ZT values) are typically better, for many applications it is more important that the resulting device be formed on a flexible substrate. As a result, although there may be some sacrifice of ZT value, using a TE material depositable on a substrate that allows fabrication of a small device with a relatively high voltage (without the need for a dc-dc converter) is better for certain applications. Unfortunately no such materials and methods are yet available.

Devices having ZT values of greater than 2.0 have been reported for Bi—Te/Sb—Te superlattices grown on single crystal GaAs. Such devices are not, however, suitable for many applications where hundreds or thousands of elements must be placed in a relatively small package.

Despite the potential and promise of TE devices, existing TE power sources have limited efficiency and electric potential when relatively small devices are made. Conventional semiconductor deposition techniques for making TE devices, such as electrochemical deposition, are not well suited for building optimally designed TE power sources. Difficult syntheses have limited the construction of many TE devices to bulk materials or minute quantities—each suffering from shortcomings in size or performance.

For example, currently available TE modules have structures similar to that depicted in prior art FIG. 1$b$, with each distinct thermoelement typically having a length and width on the order of a few millimeters. Such modules are described, for example, in U.S. Pat. No. 6,388,185 and C. B. Vining, Nature 413:577 (Oct. 11, 2001). These modules cannot provide voltages that readily match the input requirements of many devices, including power conditioning electronics.

A practical approach to building high-voltage, thin-film TE devices capable of microwatt power output in relatively small packages is needed. In addition, TE devices using a temperature gradient of about 10° C. or less would be helpful as well as TE devices operating at or near ambient temperatures. A number of applications require TE devices that operate at such temperatures and/or on such temperature gradients. For example, sensors used for building climate control or for other applications such as military applications where ambient energy is utilized if possible, operate on only 5 to 20° C. temperature differences.

SUMMARY

A key parameter affecting the voltage produced by TE modules (also referred to herein as couples or thermocouples) is the length-to-area (L/A) ratio of the individual thermoelements, where A is the cross sectional area of a thermoelement. Current monolithic (or discrete element) modules are characterized by L/A values of less than about 20 cm$^{-1}$. Although some superlattice TE devices have been proposed that have L/A values that are much higher than the current monolithic devices, the superlattice TE devices suffer other shortcomings. Current superlattice TE devices have been proposed to comprise a n-type superlattice structure having alternating layers of 50 Å in thickness with individual n-type elements being about 0.0001 cm in total thickness. Although superlattice TEs are relatively efficient with relatively high Seebeck coefficients, there is no superlattice TE technology where films are depositable on flexible substrates. Currently, all superlattice materials are deposited on single crystals; the films are grown on GaAs substrates and then are removed and applied to another substrate. Thus, superlattice TEs are not typically useful for applications requiring small or compact TE devices.

Accordingly, disclosed are thin film thermoelectric (TE) modules and power sources. Certain embodiments of the disclosed thin film TE modules and power sources have relatively large L/A ratio values, greater than about 20 cm$^{-1}$ and perhaps more typically greater than about 100 cm$^{-1}$. Certain embodiments of the disclosed thin film TE modules and power sources have even larger L/A ratio values, for example up to about 1,000 to about 10,000 cm$^{-1}$ or greater. The L/A ratio values of certain embodiments of the disclosed TE power sources allow fabrication of μW to W power supplies providing voltages greater than 1 volt even when activated by relatively small temperature differences, such as 20° C. or 10° C., and certain embodiments even at temperature differences as small as about 5° C. The size of the disclosed TE power sources are relatively small—having volumes in the range of one to ten cm$^3$—much smaller than existing devices that operate in the 1 µW to 1 W range, and certain embodiments provide voltages of greater than 1 V.

More specifically, the disclosed TE power sources comprise, in part, arrays of TE couples having multiple thermoelements (e.g., an n-type and a p-type thermoelement pair). The thermoelements are formed of sputter deposited thin films of $Bi_xTe_y$, $Sb_xTe_y$, and $Bi_xSe_y$ alloys where x is typically about 2 and y is typically about 3. The thermoelements form the modules (thermocouples) for converting thermal energy to electrical energy. Such thermoelements typically comprise thin films of TE materials having L/A ratios greater than about 500 cm$^{-1}$. The devices include modules where thin films of p-type and n-type TE materials are deposited, e.g., on a suitable flexible substrate and are electrically connected to one another in series or in series-parallel.

Embodiments of the TE power sources comprise multiple TE modules, a hot junction (or heat source) and a cold junction (some mechanism for removing heat). The TE power source may additionally include one or more ceramic plates or a ceramic-coated metallic shoe or the like.

Novel methods of constructing such TE elements, modules and devices, including sputter deposition of $Bi_xTe_y$, $Sb_xTe_y$, and $Bi_xSe_y$ alloys (where x is typically about 2 and y is typically about 3) and the use of templates are also disclosed. The process may be used to deposit n-type and p-type films that exhibit useful TE properties. In addition, in certain embodiments, electrically conductive material connecting the thermoelements of the module are sputter deposited as well. When deposited onto flexible substrates, such films find many practical uses where a TE module of almost any configuration is required.

BRIEF DESCRIPTION OF THE DRAWINGS

FIG. 1a is a representation of a prior art illustration of a basic approach to thermoelectric energy conversion.

FIG. 1b is a diagram showing a prior art arrangement of discrete TE elements.

FIG. 1c is a representation illustrating the L/A ratio parameters for a single prior art TE element as shown in the device of FIG. 1b.

FIG. 2b illustrates the L/A ratio parameters for a single p-type thin film TE element of the embodiment of the module illustrated in FIG. 2a.

FIG. 9b illustrates representative dimensions of thermoelements in the embodiment of the TE thin film modules depicted in FIG. 9a.

DETAILED DESCRIPTION

Disclosed are TE modules comprising pairs of sputter deposited thin film thermoelements and electrically conductive members connecting the thermoelements to one another in series or in series-parallel. Also disclosed are TE power source devices formed of multiple TE couples such as arrays of TE couples wherein the thin film thermoelements have an L/A ratio of greater than at least about 20 cm$^{-1}$ or greater than about 100 cm$^{-1}$ with certain embodiments having an L/A ratio of greater than 1000, 10,000 and even higher.

Unless otherwise indicated, all numbers expressing quantities of ingredients, properties such as L and A values, thicknesses, power levels, and so forth used in the specification and claims are to be understood as being modified by the term "about" whether explicitly stated or not. Accordingly, unless indicated clearly to the contrary, the numerical parameters set forth are approximations.

Figure 2A:
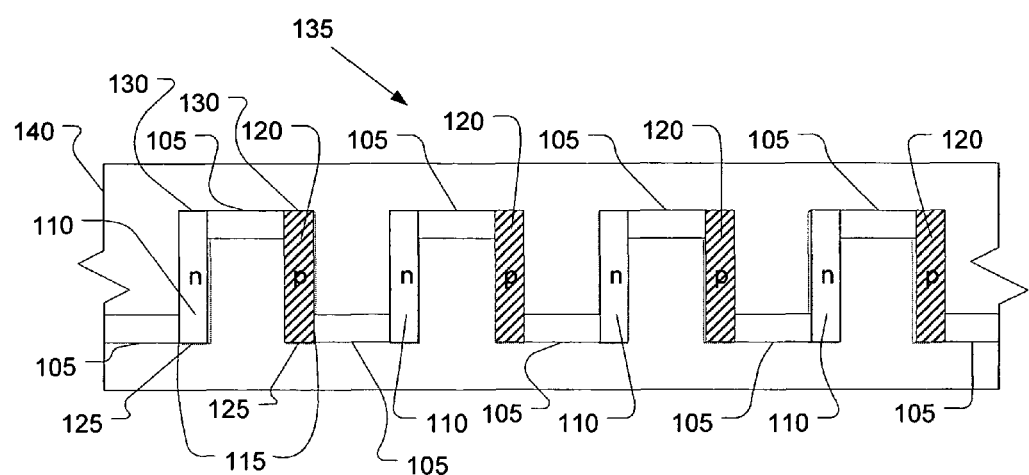
FIG. 2a illustrates a portion of an embodiment of the disclosed n-type/p-type TE thin film modules.

One embodiment of multiple thin film TE modules 115 utilized to form the disclosed TE power source 100 (see e.g., FIG. 4) is shown in FIG. 2a. FIG. 2a depicts a portion 135 of the TE power source 100, the portion 135 comprising the multiple TE modules 115 formed on a substrate 140. The TE modules 115 comprise pairs of n-type thermoelements 110 and p-type thermoelements 120 formed of semiconductor thin films.

Figure 14:
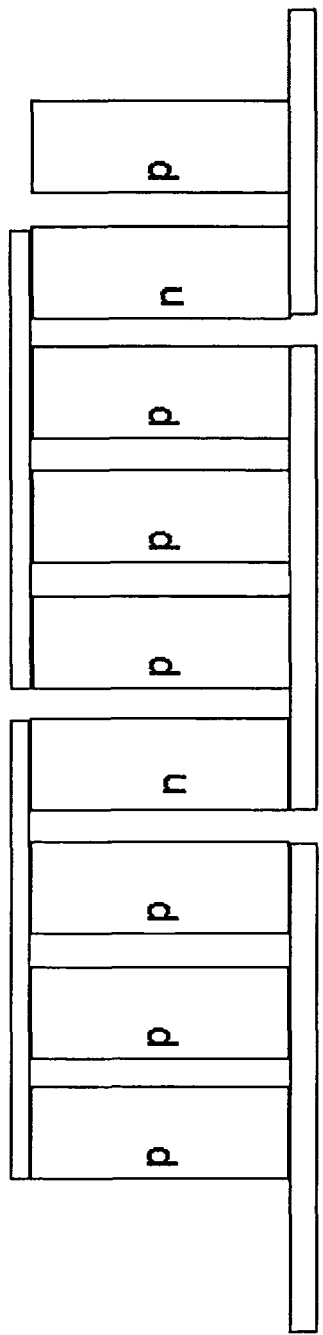
FIG. 14 shows an embodiment of the disclosed n-type and p-type TE thin films deposited on a flexible substrate wherein the n-type and p-type TE thin films are connected in a series-parallel arrangement.

Alternating n-type and p-type thermoelements 110, 120 of the TE modules 115 may be positioned parallel to one another as shown in FIG. 2a, in series-parallel as shown in FIG. 14, or may be placed in other suitable fashions (as mentioned below). Electrical connection (through electrically conductive member 105) of one n-type thermoelement 110 with one p-type element 120 forms a complete, single TE module 115 (also referred to as a thermocouple or a couple). Electrically conductive members 105 connect the n-type thermoelements 110 to p-type thermoelements 120, for example, alternately at adjacent thermoelement first ends 125 and adjacent thermoelement second ends 130 (as shown in FIG. 2a).

Figure 3:
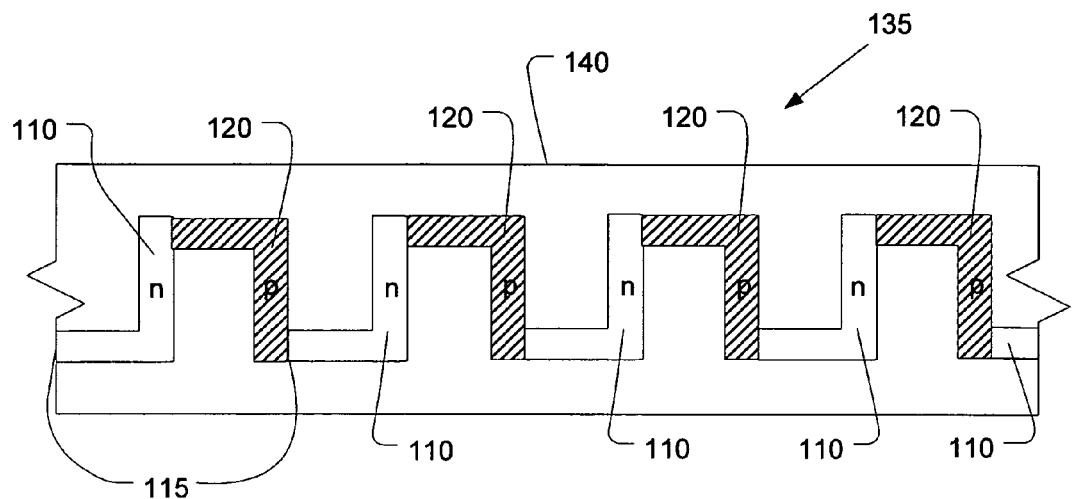
FIG. 3 illustrates a portion of an embodiment of the disclosed n-type/p-type TE thin film modules.

The electrically conductive members 105 may be substantially perpendicular to the elements 110, 120 or may be positioned in any suitable manner so as to electrically connect the thermoelements in series or in series parallel. In another possible configuration, there may be no separate electrically conductive members but instead the TE p-type and n-type alternating elements may be connected directly to one another, as for example shown in FIG. 3. Such a device would reduce the number of deposition steps required to form the TE module. For example, in another embodiment the n-type and/or p-type materials may be placed at angles to one another, connecting at alternating ends so that they come together at the hot and cold ends—forming a zigzag type configuration. In another possible alternative embodiment electrically conductive members are formed of the n-type or p-type elements themselves and are positioned as shown in FIG. 3. Clearly the individual TE elements and the array of TE elements making up a module may take a myriad of configurations.

The TE modules 115 may be formed on a flexible or a rigid substrate 140.

A TE power source 100 may include any number of TE couples 115 depending upon the application of the power source. Certain TE power sources comprise, e.g., from about 500 to 2000 TE modules 115. As a specific example application, a TE power source 100 used to power a temperature sensor or used to power a wireless transmitting device, with a power of 50 µW at 1.0 V, might utilize 600 to 800 n-p thermocouples (TE modules 115) with each TE element being about 1 cm long, 0.1 cm wide and 0.0001 cm in thickness. A nuclear TE power source designed to provide 100 mW at 1.0 V would potentially involve the same number of thermocouples, but the elements would more likely be about 0.2 cm in length, 1 cm wide and 0.0040 cm in thickness. The voltage required of the TE power source determines the number of thermocouples (TE modules) necessary and the desirable current determines the necessary L/A ratio of the thermoelements.

Figure 4:
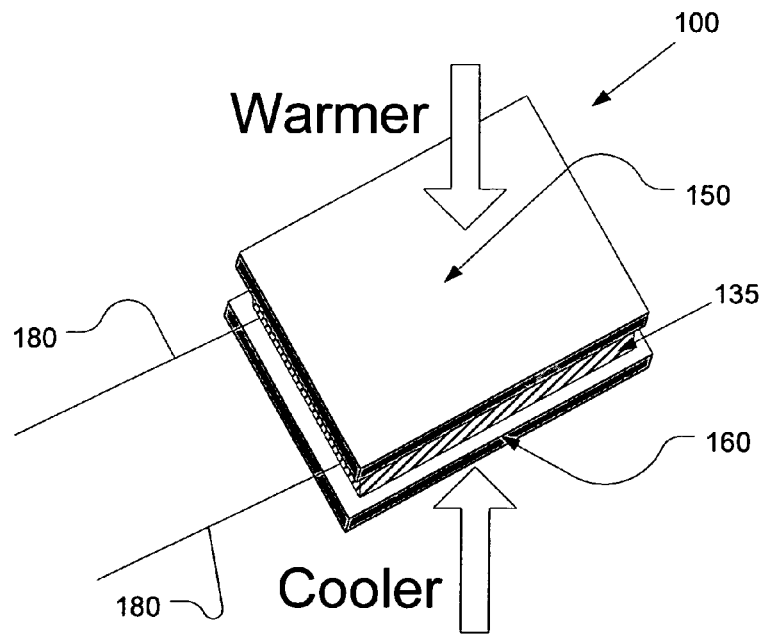
FIG. 4 illustrates an embodiment of the disclosed TE power source.
Figure 7:
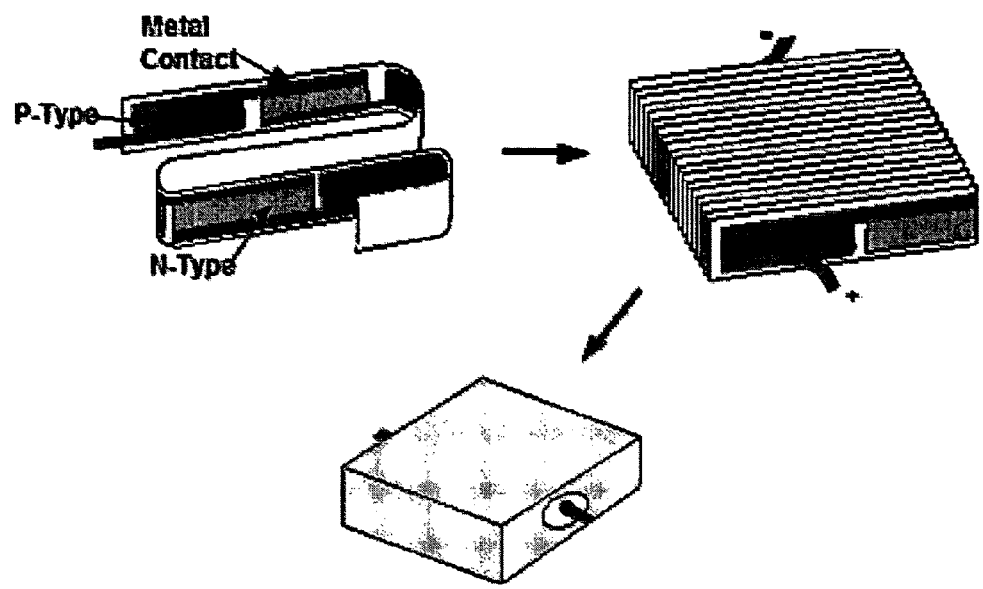
FIG. 7 illustrates an embodiment of the disclosed power source wherein arrays of TE thin film modules, such as those of FIG. 2a, FIG. 3, FIG. 6 or modules with relatively wider thermoelements are folded in an accordion configuration.
Figure 8:
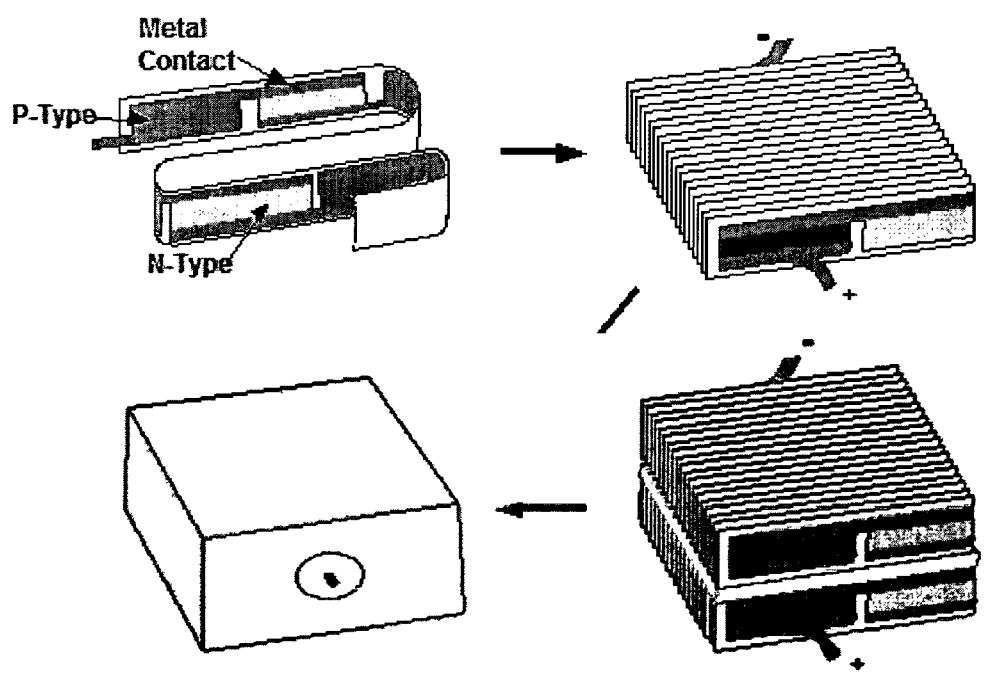
FIG. 8 illustrates an embodiment of the disclosed power source device wherein a nuclear heat source is positioned between arrays of TE thin film modules folded in an accordion configuration.

Possible embodiments of a complete TE power source 100 are shown in FIGS. 4, 7 and 8. In addition to the array of TE modules 135, the TE power source may comprise thermally conductive plates 150, 160, such as ceramic plates on the upper and lower edges of the substrate 140 (as shown in FIG. 4), a single ceramic plate, a ceramic shoe or other suitable enclosure devices. Electrical leads 180 are connected to the array of TE couples 135 of the TE device 100 to receive and transmit the electrical energy produced by the device.

The embodiment of the thin film TE power source 100 may further comprise a hot junction (or heat source) and a cold junction. The hot junction or heat source may comprise any suitable source depending upon the application of the device, for example a chemical energy source, heat from the environment, or a nuclear heat source as shown in FIG. 8. The cold junction may comprise any suitable heat removal mechanism constructed or positioned in a manner that allows heat to be relieved from or extracted from the TE power source. For example, the cold junction may comprise a heat pipe arrangement or exposure to the environment by, e.g., convection cooling.

Figure 5:
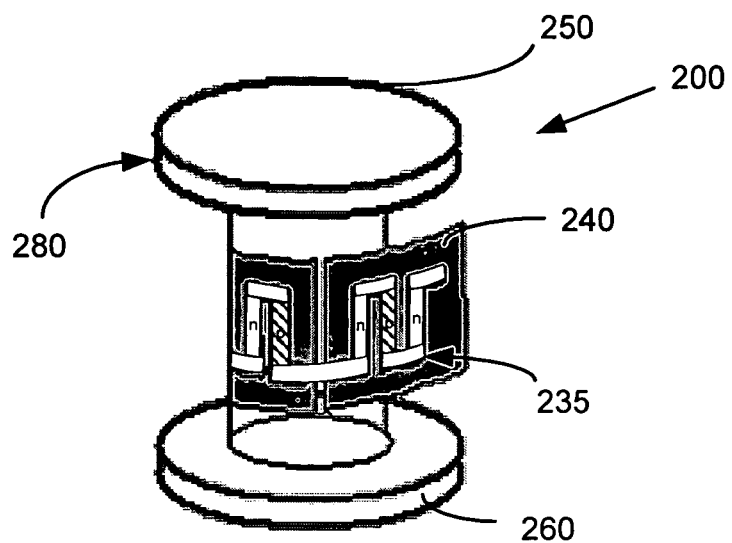
FIG. 5 illustrates an embodiment the disclosed TE power source in which TE thin film modules, such as those illustrated by FIG. 6, are wound about a spindle.
Figure 6:
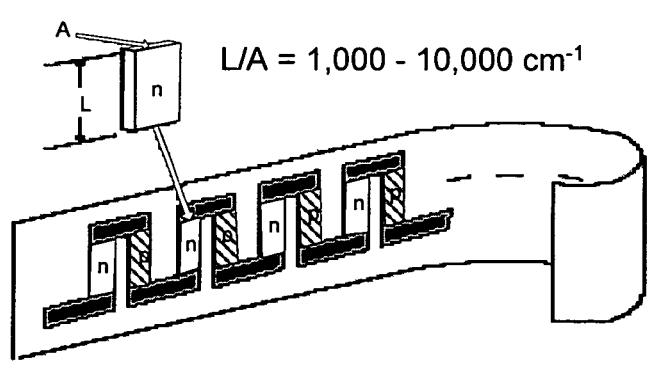
FIG. 6 illustrates an embodiment of the disclosed n-type/p-type TE thin film modules as deposited on a flexible substrate.

In another particular embodiment the TE power source 200 comprises multiple TE couples forming an array of modules 235 deposited onto a flexible substrate 240 (FIG. 5). The array of couples 235 is wound in a coil like fashion and positioned between hot and cold junctions 250 and 260. The array module 235 may simply form a coil or may be wound about an apparatus such as a spindle 280. Such a configuration provides an even smaller TE power source without sacrificing power output.

If a TE power source application requires relatively large currents, the internal resistance of the TE array is preferably made to be relatively low. To do so may involve forming thermoelement films that have relatively low values of L/A. To create films with lower L/A values, relatively wide thermoelements may be deposited and used. The TE power source depicted in FIGS. 7 and 8 may utilize thin film thermoelements having relatively large widths deposited on a flexible substrate such as polyimide tape. The TE module array may then be configured in an accordion-like arrangement and packaged with appropriate feedthroughs, as shown in FIGS. 7 and 8.

The current density of TE power sources as disclosed herein will depend on the total number of thermoelements, and the L and A values for the thermoelements. Put another way, if particular current densities are desirable for a particular TE power source, the number of thermoelements and L and A values may be manipulated to meet such requirements. Referring to an embodiment configured as shown in FIG. 3, if the thermoelements were deposited to have an L value of 1 cm, a width of 0.1 cm and a film thickness of 0.0001 cm, a TE power source based on about 500 of such thermoelements would produce 10 micro amps, whereas with wider thermoelements such as discussed in relation to and illustrated in FIGS. 7 and 8, a current of 100 milliamps could be produced. With either such embodiments, a current density of about 1 Amp/cm$^2$ would flow.

Thin Film TE Thermoelements

The TE thermoelements, although depicted in most of the figures as rectangular in shape, may take any suitable shape. Clearly, with rectangular-shaped thermoelements the dimensions may also be varied depending upon the ultimate application of the resulting TE power source being fabricated. For example, the dimensions of the individual thermoelements length, width, and thickness as well as the number of elements and the array configuration may all be changed (see, e.g., FIGS. 9a and 9b). The resistivity of the n-type and p-type materials may be different, so if one desires to minimize the total resistance, the L/A ratios can be manipulated. In addition, the p-type thermoelements may have different dimensions, such as different widths, than those dimensions of the n-type elements. Furthermore, for thermoelements of widths too great to be easily folded or coiled on a flexible substrate, the thermoelements may be broken up into separate pieces positioned in parallel to one another and in series with the opposite type thermoelements, such as, for example, the configuration shown in FIG. 14 (i.e., in series-parallel configurations).

One group of thermoelectric materials for power generation in the 0° C. to the 100° C. temperature range are semiconductors and related alloys based on $Bi_xTe_y$, $Sb_xTe_y$, and $Bi_xSe_y$, where x is typically about 2 and y is typically about 3. The values of x and y may vary depending upon the power supplied to the sputter deposition targets (or equivalently the flux coming from each target). Such thin film thermoelement materials can be sputtered onto a variety of substrates, such as very useful flexible substrates (e.g., polyimide films such as those currently manufactured by the DuPont Corporation under the KAPTON trademark) which allow for fabricating very compact TE power sources.

The films forming the thermoelements 110, 120 may vary in thickness, but certain embodiments of the disclosed TE devices include thermoelements having thicknesses of at least 0.1 mm. The desirable thickness depends on the ultimate application of the TE power source being fabricated. In addition, the thickness variation will depend on the sputtering system arrangement, but typically fall within +/−5%.

The thermoelements 110, 120 may vary in area but certain embodiments of the disclosed TE devices include thermoelements having an L/A ratio of greater than about 50 cm$^{-1}$. Of course, as mentioned above, the L and A values and/or other dimensions of the thermoelements may be varied as desired according to the desired application of the resulting TE device. The range for the L, A and thickness values depend on the power requirements of the ultimate TE power source being made. If it is desirable to have a power source having a voltage of 1.0 or 2.0 volts, then the choice of L/A values depends on the current requirements. For example, in the first two specific embodiments described above, the L/A value for a TE power source for a sensor is 100,000 and for a nuclear battery the L/A ratio is 50. The third specific embodiment involves an array of TE thermoelement modules having an L/A value about in the range of prior art discrete elements.

An advantage of the present methods for fabricating TE thermoelements is that the thermoelements are being sputter deposited and thus are more controllable and easily manipulated than are thermoelements made by standard approaches involving the growth of crystalline boules followed by cutting. Such prior approaches to defining the thermoelement L/A ratios are impractical on a small scale, let alone on a commercial scale. The templates used in the deposition of the thermoelement thin films are simply varied accordingly; see, for example, FIGS. 12a-12c.

Sputter deposited thin films based on superlattice structures can also be used to fabricate the thermoelectric power sources. Each n-type and p-type film could consist of a multilayer film structure with the individual layers being approximately 10 Å to 200 Å thick, and the total film thickness varying as described for the homogeneous films described herein. For example, and not meant to be limiting, a n-type superlattice film might consist of alternating $Bi_2Te_3$ and $Sb_2Te_3$ layers with thicknesses of 50 Å and 150 Å, respectively, which are deposited at ambient conditions. A p-type superlattice structure may involve a similar structure, but grown with a different substrate temperature. These film structures can have larger values of electrical conductivity and Seebeck coefficient, and lower values of thermal conductivity, all of which allow improved power source efficiency.

Substrate Materials

In certain embodiments, the p-type and n-type TE thermoelements are deposited onto a flexible substrate. The flexible substrate may be, e.g., a polyimide, such as KAPTON, however, any suitable flexible substrate may be used. The substrate should be able to withstand sputter deposition conditions without undue deterioration. In other embodiments TE materials are deposited on a substrate comprising any suitable sufficiently rigid substrate (e.g., glass or other electrically insulating materials that possess relatively low thermal conductivities). Essentially any electrically insulating substrate 140 (FIG. 2a) (or substrate coated with an insulating material) may be utilized for the rigid or flexible TE device as long as the substrate can withstand the deposition conditions and can meet required thermal conductivity levels.

Electrically Conductive Members

Figure 12A:
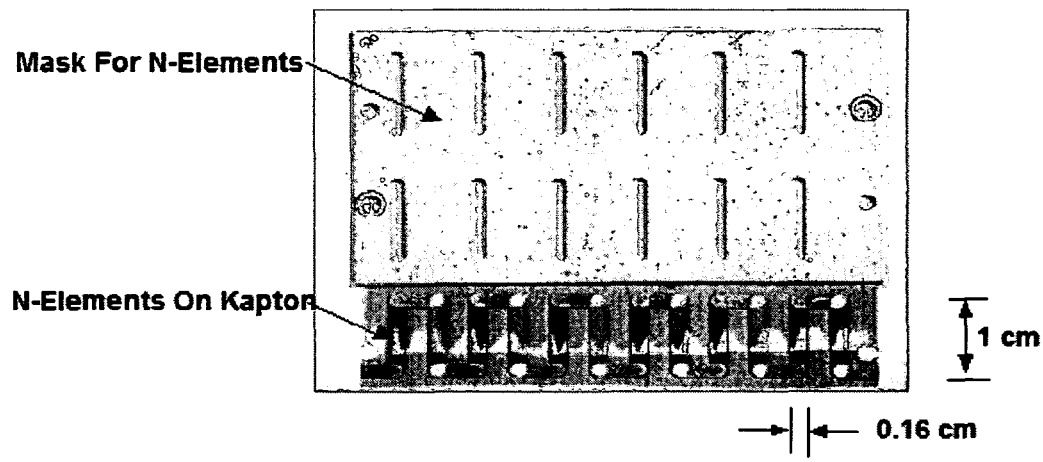
FIG. 12a is a photograph of a representative mask suitable for use in depositing n-type thermoelements in the configuration shown in the embodiments of the TE modules of FIG. 2a and FIG. 6.
Figure 12B:
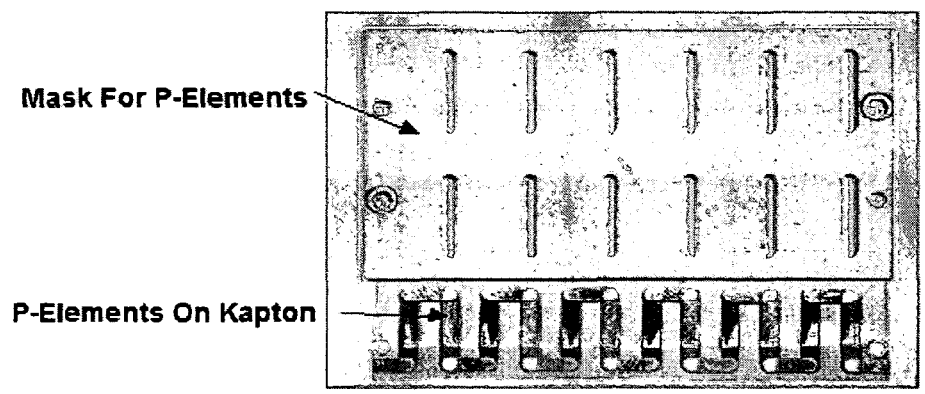
FIG. 12b is a photograph of a representative mask suitable for use in depositing p-type thermoelements in the configuration shown in the embodiments of the TE modules of FIG. 2a and FIG. 6.
Figure 12C:
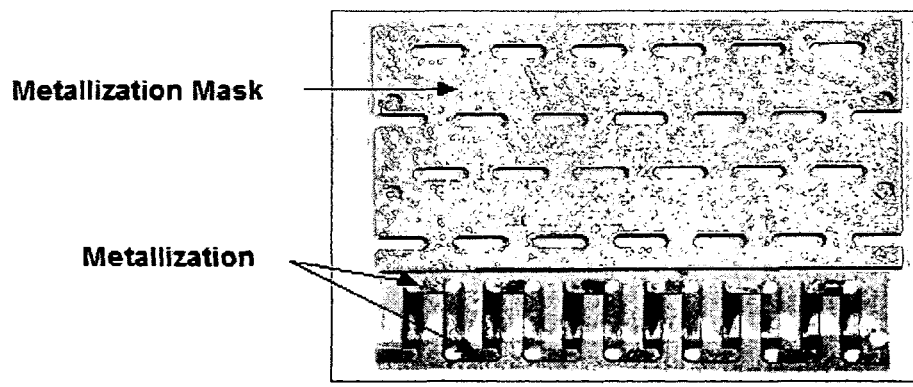
FIG. 12c is a photograph of a representative mask suitable for use in depositing conducting connectors in the configuration shown in the embodiments of the TE modules of FIG. 2a and FIG. 6.
Figure 13:
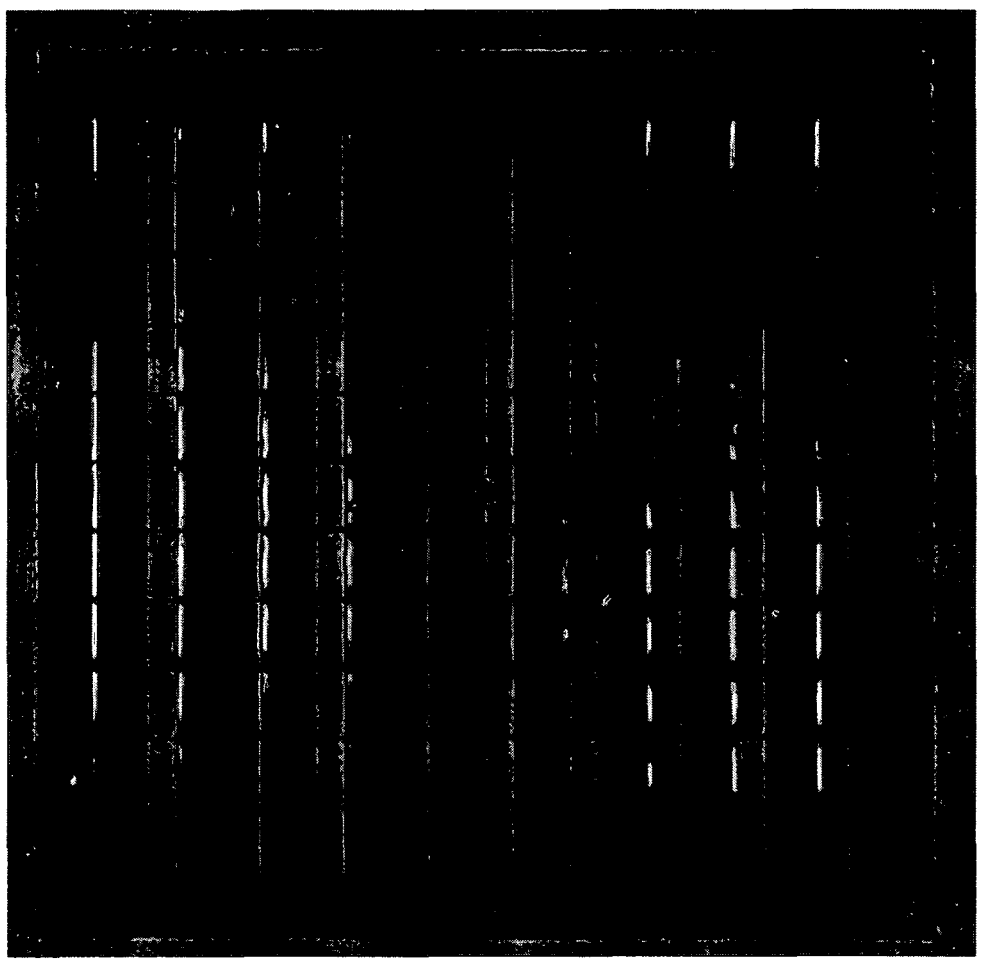
FIG. 13 is a photograph of disclosed n-type and p-type TE thin film modules deposited on a flexible substrate.

As discussed above, TE modules are formed by electrically connecting a thin film n-type thermoelement to a p-type thermoelement through electrically conductive members. The electrically conductive members may comprise any suitable electrically conductive material. For example, the electrically conductive members may comprise a metal, such as aluminum, gold, nickel, and mixtures thereof. In one particular embodiment the conductive members comprise a nickel layer formed on the substrate and a gold layer formed on the nickel layer Methods for Constructing Thin Film TE Elements TE thin film thermoelements and TE modules are formed by sputter deposition. In particular embodiments a mask or template is used as shown in FIGS. 12a-12c. The masks may be formed by standard lithography and/or etching techniques to control the shape and position of each TE thermoelement and conductive member on a substrate.

Figure 2B:
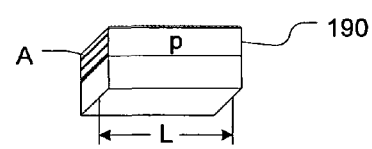

The disclosed process allows for the deposition of many (e.g., hundreds, thousands, or more) TE thermoelement couples on flexible materials such as KAPTON polyimide (available from DuPont). A representative individual p-type TE thermoelement 190 is shown in FIG. 2b, which also illustrates the L/A ratio. High voltage, µW to mW (or greater, e.g., W) TE power sources comprising hundreds or thousands of TE modules can be made with the disclosed process.

Figure 11:
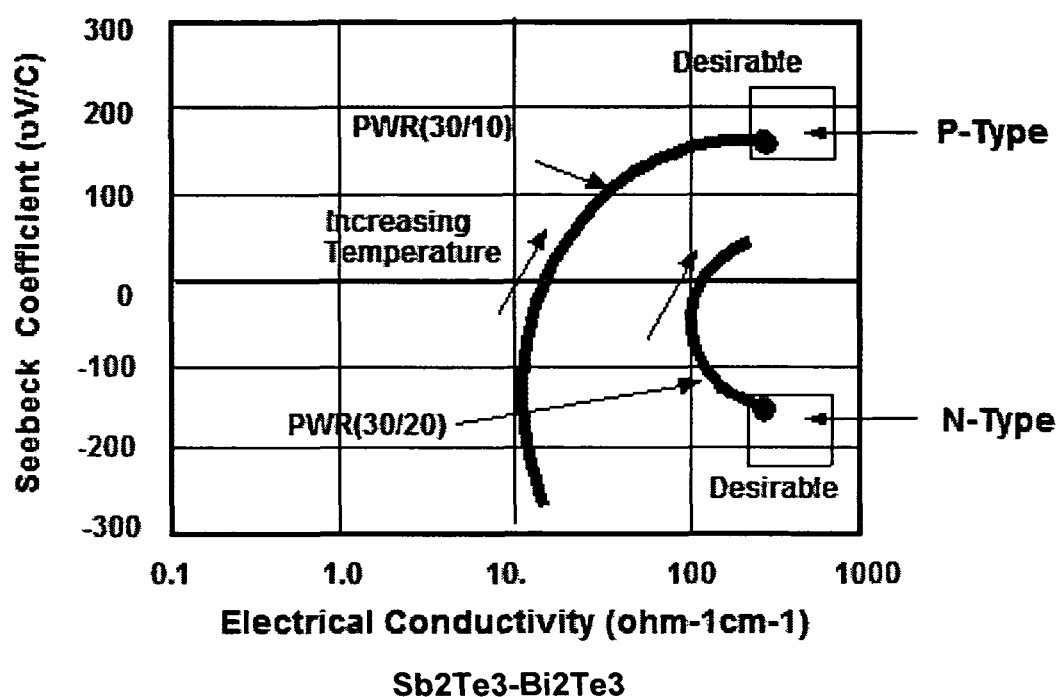
FIG. 11 is a graph showing the dependence of the Seebeck coefficient and electrical conductivity of TE materials deposited on a KAPTON substrate, on sputter deposition conditions.

With reference to FIG. 11 and Table 1 below, a wide range of sputter deposition process parameters were used to obtain TE thermoelement materials having desirable properties. In particular, a myriad of sputtering gas pressures, target powers, deposition rates, target-substrate distances and substrate temperatures were tested. Certain exemplary sputter deposition methods are specifically disclosed below but clearly other sputter deposition parameters may produce suitable thin films for forming the TE thermoelements disclosed herein.

The thin films forming the TE elements may be sputter deposited using, for example, RF magnetron sputtering. The films may be deposited simultaneously from two of three possible sources, for example, and not meant to be limiting, $Bi_2Te_3$, $Sb_2Te_3$ and $Bi_2Se_3$ alloys, or combinations thereof. The amount of RF power supplied to each of the targets, substrate temperature and sputtering gas pressure are varied for deposition conditions that result in films with desired properties which in turn depend upon the application of the device. Representative thin film material parameters and sputtering conditions are shown in FIG. 11. The specific examples given below are not to be considered limiting of the present disclosure but merely representative.

Example 1

Sputter Deposition of n-Type Thermoelements

A substrate comprising KAPTON (as well as a glass substrate) was positioned 5 inches from both a $Sb_2Te_3$ (Sb—Te) and a $Bi_2Te_3$ (Bi—Te) target in a standard sputter deposition chamber. Each target measured 2 inches in diameter. The sputter deposition chamber was evacuated to a pressure of $10^{-6}$ Torr and the system was then filled with purified argon adding to the system sputtering gas pressure (e.g., 3.0 mTorr).

The substrates and the targets were each ion cleaned for 3 to 5 minutes. Plasmas were established above the targets with 30 watts of power being supplied to the Sb—Te target and 20 watts of power to the Bi—Te target. The deposition was carried out with the substrates at ambient temperature. Under these conditions, the deposition rate was 3.5 Å/s. Thus, to deposit a one micron thick film required approximately 47 minutes.

After deposition, the thermoelement thin films were characterized. The thickness was measured with a profilometer. The resistivity and Seebeck coefficient also were determined for the deposited thermoelement thin films, as shown in FIG. 11. Resulting values are provided in Table 1.

TABLE 1

Exemplary Parameters For Deposition On KAPTON*

| Substrate Temperature (° C.) | $Sb_2Te_3$ Target Power (Watts) | $Bi_2Te_3$ Target Power (Watts) | Growth Rate (Å/s) | Resistivity (ohm-cm) | Seebeck Coefficient (μV/° C.) |
|---|---|---|---|---|---|
| Ambient | 30 | 20 | 3.5 | 0.0122 | −131 |
| 300 | 30 | 10 | 3.0 | 0.00325 | +158 |

*Sputtering Gas Pressure was 3.0 mTorr; Targets had 2.0 inch diameters; Sb—Te and Bi—Te targets were positioned 5 inches from substrate platform.

Example 2

Sputter Deposition of p-Type Thermoelements

A substrate comprising KAPTON (as well as a glass substrate) was positioned 5 inches from both a $Sb_2Te_3$ (Sb—Te) and a $Bi_2Te_3$ (Bi—Te) target in a standard sputter deposition chamber. Each target measured 2 inches in diameter. The sputter deposition chamber was evacuated to a pressure of $10^{-6}$ Torr and the system was then filled with purified argon adding to the system sputtering gas pressure (e.g., 3.0 mTorr).

The substrates were ion cleaned for 3 to 5 minutes. The substrate temperature was then raised to 300° C. The target surfaces were then ion cleaned for 3 to 5 minutes. Plasmas were established above the targets with 30 watts of power supplied to the Sb—Te target and 10 watts of power to the Bi—Te target. The deposition was carried out with the substrates at 300° C. The deposition rate was 3.0 Å/s. Thus, to deposit a one micron thick film required approximately 55 minutes.

After deposition, the thermoelement thin films were characterized. The thickness was measured with a profilometer. The resistivity and Seebeck coefficient also were determined for the deposited thermoelement thin films. Resulting values are provided in Table 1.

As shown in FIG. 11, the temperature of the substrate effectively determines the Seebeck coefficient for each of the deposited thermoelement thin films in the foregoing examples 1 and 2. The curves in FIG. 11 show the results as the temperature of the substrate was increased from ambient (approximately 20° C.) to a final temperature of about 300° C. for both the resultant p-type material and the resultant n-type material. As shown in FIG. 11, the p-type material having a Seebeck coefficient of +158 and resistivity of 0.00325 ohm-cm was formed when $Sb_2$—$Te_3$ and $Bi_2$—$Te_3$ were simultaneously sputtered at a temperature of 300° C. using 30 Watts of power to the $Sb_2$—$Te_3$ and 10 Watts of power to the $Bi_2$—$Te_3$. Conversely, the n-type material, having a Seebeck coefficient of −131 and resistivity of 0.0122 ohm-cm, was formed when $Sb_2$—$Te_3$ and $Bi_2$—$Te_3$ were simultaneously sputtered at ambient temperature (approximately 20° C.) using 30 Watts of power to the $Sb_2$—$Te_3$ and 20 Watts of power to the $Bi_2$—$Te_3$.

While the end points are described as "desirable" in FIG. 11, as shown in the respective curves of FIG. 11, each of these materials fluctuated across a wide range of Seebeck coefficients depending on the substrate temperature. Those skilled in the art will recognize that intermediate points to those shown in the curves will produce satisfactory TE elements. Further, while those skilled in the art will recognize that having one thin film with a positive Seebeck coefficient and the other thin film with a negative Seebeck coefficient will generally produce thermoelectric devices having higher power densities, since it is the delta in the Seebeck coefficients between any two thin films that produces the thermoelectric effect, given a sufficient delta between any two thin films the thermoelectric effect is nevertheless expected, and it is therefore not absolutely critical that one be positive and the other be negative. For example, and not meant to be limiting, most metals, e.g., copper, will have a Seebeck coefficient of about 0. Since copper is highly conductive, using copper as one of the thin films will produce a thermoelectric effect, provided that the other thin film has either a sufficiently high or a sufficiently low Seebeck coefficient. Since metals such as copper are generally highly conductive, an effective TE device could be produced using just such an arrangement. Therefore, the use of the terms "n-type" and "p-type" in the present application should be understood to be relative in nature; and any configurations wherein two highly conductive thin films having a sufficient delta in their Seebeck coefficients should be understood to be included in the applicant's use of the terms "n-type" and "p-type."

Example 3

Fabrication of a Thermoelectric Array on KAPTON

Figure 9A:
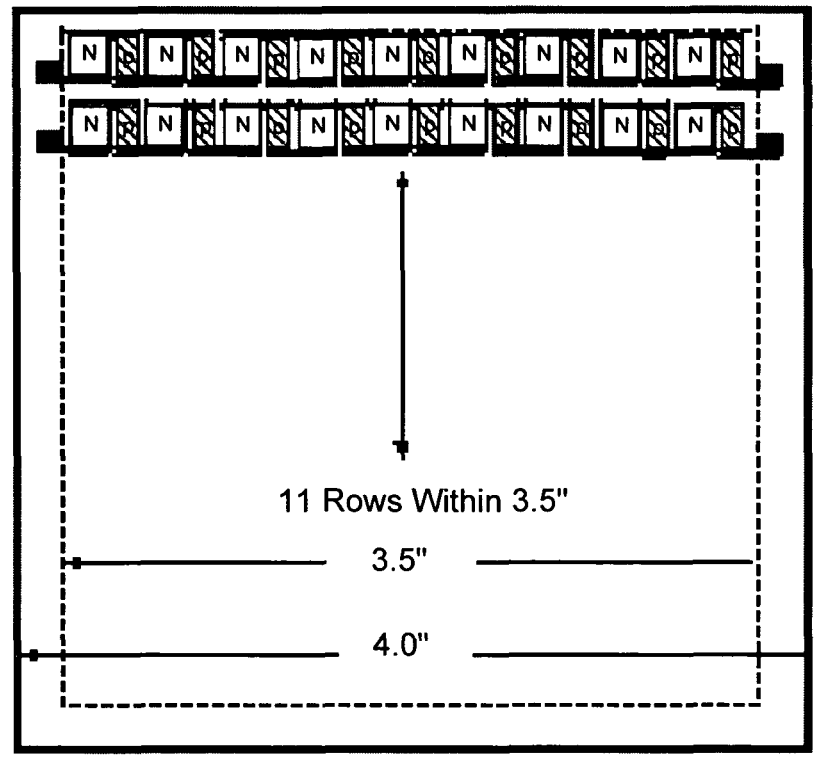
FIG. 9a is an illustration of disclosed n-type and p-type TE thin film modules deposited in an array configuration on a substrate, with representative dimensions for the same.
Figure 9B:
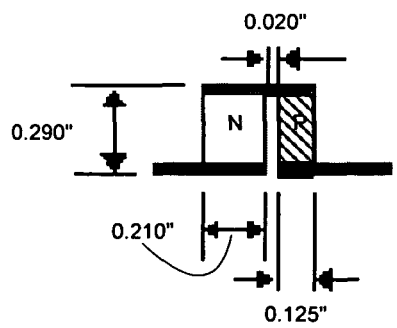
Figure 10:
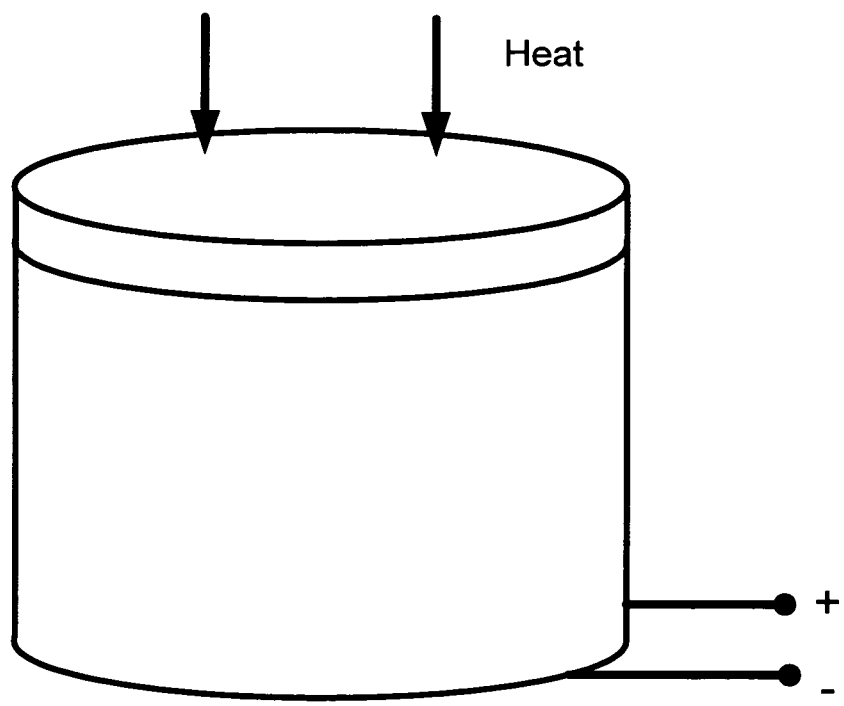
FIG. 10 illustrates a TE sensor that uses heat from one side of the thermopile.

A TE module array like those shown in FIG. 1a or 9a was fabricated on a substrate comprising KAPTON using masks such as those depicted in FIGS. 12a-12c. The p-type thermoelements were deposited first because they are deposited at 300° C. The n-type thermoelements were deposited next and then the electrically conductive members were deposited.

Specifically, a KAPTON substrate sheet using a mask as shown in FIG. 12b was positioned into a deposition chamber. The mask was securely positioned over the KAPTON sheet using round holes at each end of the mask (see FIG. 12b). Target choices and positioning and other deposition conditions and parameters were as described in Example 2.

Once the desired p-type elements were deposited, the process was stopped and the sputter deposition system opened to replace the p-type mask of FIG. 12b with an n-type mask such as the mask depicted in FIG. 12a. The n-type mask was carefully positioned over the KAPTON sheet, again using the round holes in the mask as guides. Target choices, positioning and other deposition conditions were as described in Example 1.

The process was again stopped once the n-type thermoelements were deposited to replace the n-type mask and with a metallization mask such as the mask depicted in FIG. 12c to form the electrically conductive members. The metallization mask was positioned and secured over the KAPTON sheet using round holes in the mask as guides. By standard sputter deposition procedures, 1.0 μm of aluminum was first deposited, followed by 0.1 μm of nickel.

These deposition processes produced an array of p-type and n-type thermoelement modules on a flexible substrate in the configuration shown in FIGS. 2a, 12a-12c, and 13.

The specific templates or masks shown in FIGS. 12a-12c in the foregoing procedure were used to produce two arrays of six thermocouples deposited on two different strips of KAPTON substrate. Such arrays of TE modules were, for example, assembled into a TE power source such as shown in FIG. 5. The fabrication of arrays of six TE modules would allow for production of, e.g., a 25 µW TE power source with a 1.0 V output at a temperature gradient of only 20° C.

Whereas the TE thermoelements, modules, arrays and power sources as well as the methods for making the same have been described with reference to multiple embodiments and examples, it will be understood that the invention is not limited to those embodiments and examples. On the contrary, the invention is intended to encompass all modifications, alternatives, and equivalents as may be included within the spirit and scope of the invention as defined by the appended claims.

We claim:

1. A thermoelectric power source comprising:
a flexible substrate having an upper surface; and
a plurality of thermoelectric couples with the plurality thermoelectric couples comprising:
    (a) a co-sputter deposited thin film p-type thermoelement positioned on the upper surface of the flexible substrate;
    (b) a co-sputter deposited thin film n-type thermoelement positioned on the upper surface of the flexible substrate adjacent the thin film p-type thermoelement;
    (c) an electrically conductive member positioned on the flexible substrate, and electrically connecting a first end of the thin film p-type thermoelement with a second end of the thin film n-type thermoelement, wherein the thin film p-type or the thin film n-type thermoelements comprise $Bi_xTe_y$, $Sb_xTe_y$, and $Bi_xSe_y$, wherein x is about 2 and y is about 3; and
    wherein the thermoelectric couples are formed on a single substrate and the flexible substrate is in a coil configuration or an accordion configuration.

2. The thermoelectric power source of claim 1 wherein the thermoelectric power source has a power output of from 50 µW to 1 W.

3. The thermoelectric power source of claim 1 further comprising at least about 1000 thermoelectric couples, wherein the thermoelectric power source has a power output of about 1 W with a voltage of at least about 1 volt.

4. The thermoelectric power source of claim 1 wherein the thin film p-type thermoelements each have a first width, the thin film n-type thermoelements each have a second width, and the first width is different from the second width.

5. The thermoelectric power source of claim 1 wherein two or more thin film p-type thermoelements are positioned and electrically connected in parallel with one another and the parallel positioned thin film p-type thermoelements are electrically connected in series to thin film n-type thermoelements.

6. The thermoelectric power source of claim 1 wherein the volume of the thermoelectric power source is less than about 10 cm³ and has a power output of from about 1 µW to about 1 W.

7. The thermoelectric power source of claim 1 wherein two or more thin film n-type thermoelements are positioned and electrically connected in parallel with one another and the parallel positioned thin film n-type thermoelements are electrically connected in series to thin film p-type thermoelements.

8. The thermoelectric power source of claim 1 wherein the volume of the thermoelectric power source is less than about 10 cm³ and provides voltages of greater than about 1 volt.

9. The thermoelectric power source of claim 8 wherein the thermoelectric power source produces power at temperature differences of about 20° C. or less.

10. The thermoelectric power source of claim 1 further comprising at least about 50 thermoelectric couples, wherein the thermoelectric power source has a power output of at least about 1 µW with a voltage of at least about 0.25 volt.

11. The thermoelectric power source of claim 10 wherein the p-type or the n-type thermoelements are at least about 1 mm in length and at least about 0.1 mm in width.

12. The thermoelectric power source of claim 10 wherein the thin film p-type or the thin film n-type thermoelements are at least about 0.1 mm in thickness.

13. A thermoelectric power source comprising:
a flexible substrate having an upper surface; and
a thermoelectric couple comprising:
    (a) alternating thin film p-type and thin film n-type thermoelements positioned on the upper surface of the flexible substrate;
    (b) an electrically conductive member positioned on the flexible substrate, and electrically connecting a first end of the thin film p-type thermoelement with a second end of the thin film n-type thermoelement, wherein the thin film p-type or the thin film n-type thermoelements comprise $Bi_xTe_y$, $Sb_xTe_y$, and $Bi_xSe_y$, wherein x is about 2 and y is about 3; and
    (c) wherein the flexible substrate is in a coil configuration.

14. The thermoelectric power source of claim 13 wherein the thin film p-type thermoelements or the thin film n-type thermoelements are at least about 1 mm in length and at least about 0.1 mm in width.

15. The thermoelectric power source of claim 13 wherein the volume of the thermoelectric power source is less than about 10 cm³ and has a power output of from about 1 µW to about 1 W.

* * * * *